US007593264B2

United States Patent
Shih et al.

(10) Patent No.: US 7,593,264 B2
(45) Date of Patent: Sep. 22, 2009

(54) METHOD AND APPARATUS FOR PROGRAMMING NONVOLATILE MEMORY

(75) Inventors: Yi Te Shih, Zhubei (TW); Jer-Hao Hsu, Beidou Town (TW); Yi-Ti Wang, Xinhua Town (TW); Hsueh-Yi Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/532,054

(22) Filed: Sep. 14, 2006

(65) Prior Publication Data

US 2007/0159887 A1 Jul. 12, 2007

Related U.S. Application Data

(60) Provisional application No. 60/757,344, filed on Jan. 9, 2006.

(51) Int. Cl.
    *G11C 16/04* (2006.01)
(52) U.S. Cl. .............................. 365/185.18; 365/185.16; 365/185.02; 365/185.13; 365/185.28; 365/185.29
(58) Field of Classification Search ............ 365/185.18, 365/185.16, 185.02, 185.13, 185.28, 185.29
    See application file for complete search history.

(56) References Cited

U.S. PATENT DOCUMENTS

| | | | | | |
|---|---|---|---|---|---|
| 5,204,835 | A | * | 4/1993 | Eitan | 365/185.16 |
| 5,293,350 | A | * | 3/1994 | Kim et al. | 365/238.5 |
| 5,654,917 | A | * | 8/1997 | Ogura et al. | 365/185.18 |
| 5,748,535 | A | * | 5/1998 | Lin et al. | 365/185.22 |
| 5,818,757 | A | * | 10/1998 | So et al. | 365/185.18 |
| 5,835,414 | A | * | 11/1998 | Hung et al. | 365/185.25 |
| 6,128,226 | A | * | 10/2000 | Eitan et al. | 365/185.21 |
| 6,181,597 | B1 | * | 1/2001 | Nachumovsky | 365/185.03 |
| 6,236,595 | B1 | | 5/2001 | Gerber et al. | |
| 6,477,083 | B1 | * | 11/2002 | Fastow et al. | 365/185.16 |
| 6,657,894 | B2 | | 12/2003 | Yeh et al. | |
| 6,670,669 | B1 | * | 12/2003 | Kawamura | 257/314 |
| 6,937,523 | B2 | * | 8/2005 | Eshel | 365/185.28 |
| 7,133,317 | B2 | * | 11/2006 | Liao et al. | 365/185.28 |
| 7,283,397 | B2 | * | 10/2007 | Harari et al. | 365/185.22 |
| 2001/0003366 | A1 | * | 6/2001 | Hayashi | 257/315 |
| 2005/0088878 | A1 | * | 4/2005 | Eshel | 365/185.28 |
| 2005/0169055 | A1 | * | 8/2005 | Lung | 365/185.17 |
| 2005/0173751 | A1 | * | 8/2005 | Ishii et al. | 257/314 |
| 2006/0170038 | A1 | * | 8/2006 | Wong et al. | 257/330 |

OTHER PUBLICATIONS

F. Sigworth, Two-Microelectrode Voltage Clamp, May 1999, waronline.com/pdf/tutorials/sigworth_clamp.pdf, p. 5.*

* cited by examiner

*Primary Examiner*—Hoai V Ho
*Assistant Examiner*—Fernando N Hidalgo
(74) *Attorney, Agent, or Firm*—Kenta Suzue; Haynes Beffel & Wolfeld LLP

(57) ABSTRACT

Embodiments of addressing the programming disturb effect are shown. A medium voltage having a magnitude between the programming voltage and ground is applied to a metal bit line among the cells that are subject to the program disturb effect.

14 Claims, 5 Drawing Sheets

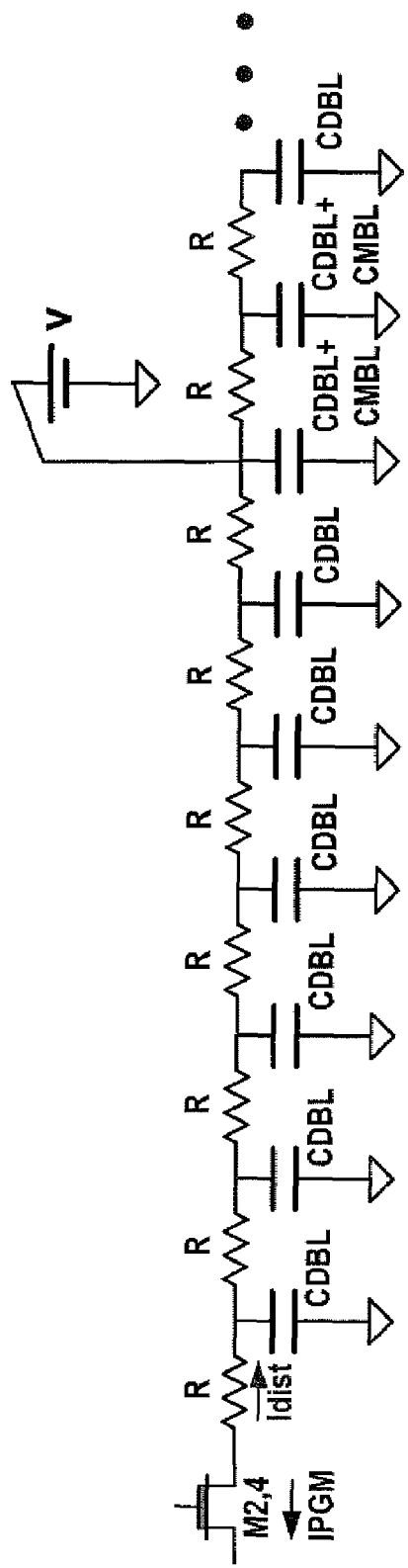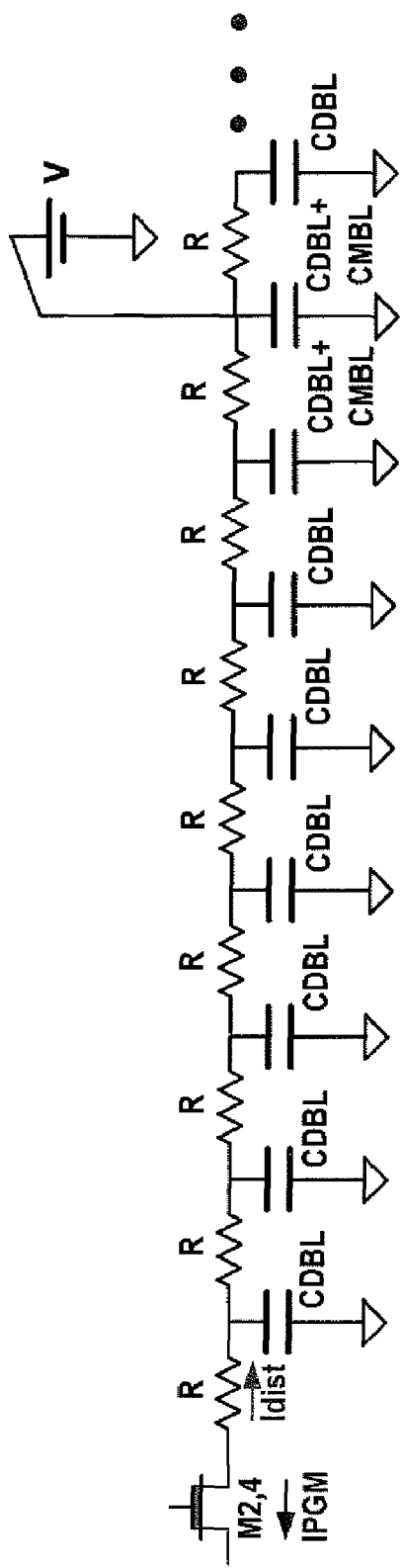
FIG. 3
FIG. 4

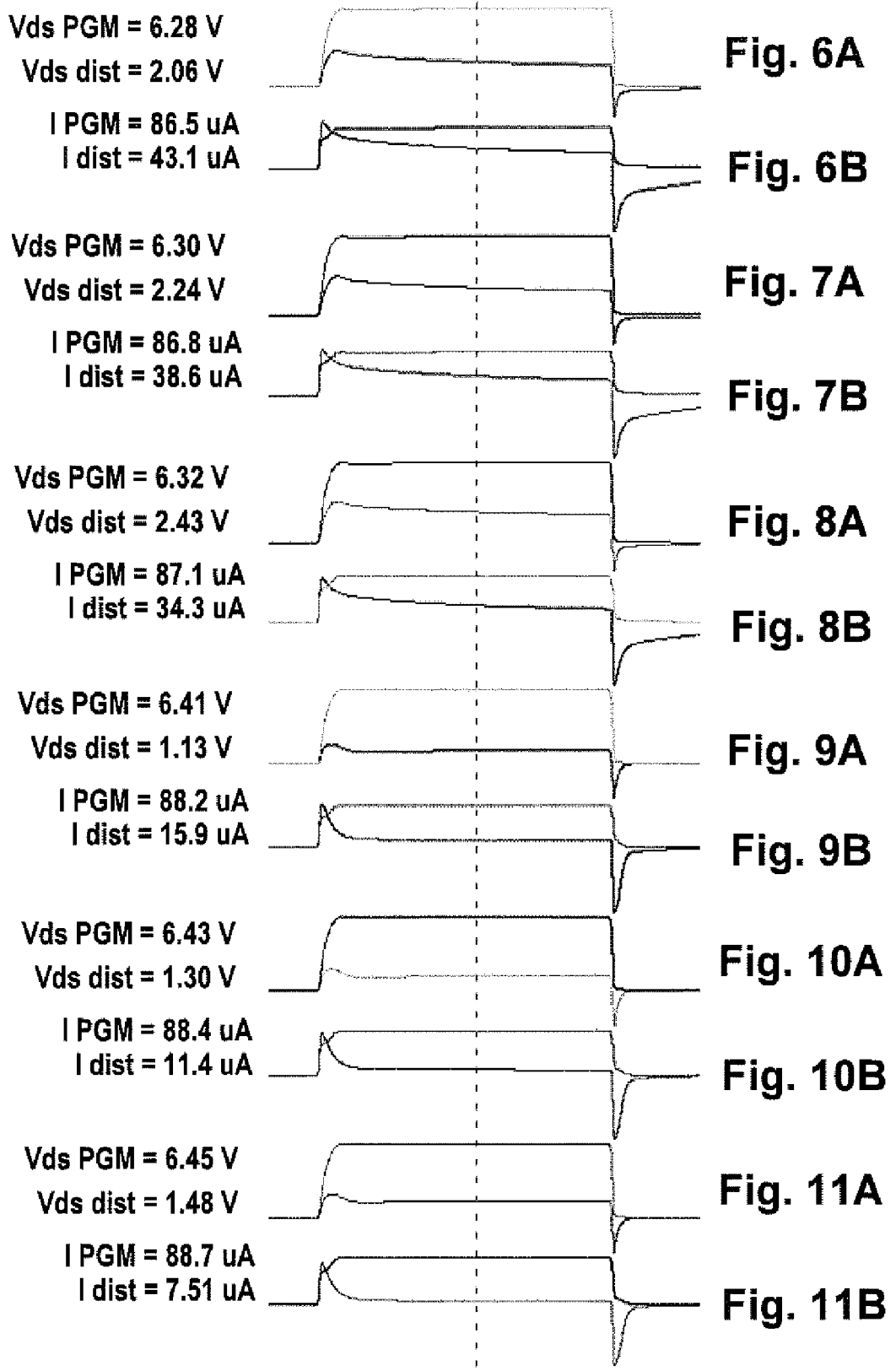

METHOD AND APPARATUS FOR PROGRAMMING NONVOLATILE MEMORY

REFERENCE TO RELATED APPLICATION

This application claims the benefit of U.S. Provisional Patent Application No. 60/757,344, filed 9 Jan. 2006 by inventors Yi-Te Shih, Jer-Hau Hsu, Yi-Ti Wang and Hsueh-Yi Lee entitled Method and Circuit Implementation of Preventing Program Disturb.

BACKGROUND OF THE INVENTION

1. Field of the Invention

The present technology relates to nonvolatile memory cells, and in particular to nonvolatile memory cells subject to the program disturb effect.

2. Description of Related Art

The program operation of a nonvolatile memory cell is complicated by the program disturb effect. Programming refers to adding charge to, or removing charge from, selected memory cells of a memory array, unlike the indiscriminate erase operation which resets typically an entire sector of memory cells to the same charge storage state. The invention encompasses both products and methods where programming refers to making the net charge stored in the charge trapping structure more negative or more positive, and products and methods where erasing refers to making the net charge stored in the charge trapping structure more negative or more positive. In the program disturb effect, programming of a selected cell leads to unwanted programming of unselected memory cells adjacent to the selected cell. In particular, the program disturb effect leads to unwanted programming of memory cells that are: 1) located in columns adjacent to the column including the selected cell and 2) connected to the selected row line (the word line providing a gate voltage to the selected cell). The integrity of the memory array is adversely affected by these problems For example, the drain-to-source voltage Vds of the disturbed cell can be about 2.5 V, and drain current about 35-45 uA, shifting the threshold voltage more than 50 mV.

A prior approach of addressing the program disturb effect attempts to alleviate the conditions giving rise to the unwanted programming of unselected memory cells, Unselected memory cells are programmed because of an unwanted voltage difference across the bit lines connected to the unselected memory cells which are in the columns nearby the column of the selected cell. For example, if a bit line voltage is raised to program a memory cell positioned on one side of the bit line, then the program disturb effect tends to program the adjacent memory cell on the other side of the bit line as well. Applying a program voltage to not just a bit line adjacent to the memory cell to be programmed, but also to additional bit lines of memory cells that would otherwise be subject to the program disturb effect, does not appear to solve the program disturb effect. These additional applications of the program voltage effect to other bit lines changes the location of the disturbed cell, instead of prevent the program disturb effect.

Therefore, it would be advantageous to address the program disturb effect, rather than simply shift the location of the program disturb effect.

SUMMARY OF THE INVENTION

One aspect is a nonvolatile memory includes an array of nonvolatile memory cells, bit lines, and logic. Each of the nonvolatile memory cells has current-carrying terminals, typically a source and drain. The bit lines are electrically connected to the current-carrying terminals of the nonvolatile memory cells.

The logic is coupled to the bit lines, and has code responsive to an instruction to program a particular nonvolatile memory cell of the array by applying a voltage arrangement to the bit lines to program that nonvolatile memory cell. The voltage arrangement includes a first bit line voltage, a second bit line voltage, and a third bit line voltage. The first bit line voltage is applied to the first bit line electrically connected to the first current-carrying terminal (source or drain) of the nonvolatile memory cell to be programmed. The second bit line voltage is applied to the second bit line electrically connected to the second current-carrying terminal (drain or source) of the nonvolatile memory cell to be programmed The first bit line voltage has a larger magnitude than the second bit line voltage.

The same word line, which controls the memory cell to be programmed, also controls other memory cells. These other memory cells are on one side or the other of the memory cell to be programmed, also called the first bit line side or the second bit line side, respectively referring to the sides of the memory cell with the first current-carrying terminal and the second current-carrying terminal. The third bit line voltage is applied to the third bit line electrically connected to at least one nonvolatile memory cell on a second bit line side of the nonvolatile memory cell to be programmed. The third bit line voltage has a magnitude in between magnitudes of the first bit line voltage and the second bit line voltage.

In some embodiments, the third bit line voltage reduces a magnitude of current from the second bit line through any nonvolatile memory cells on the second bit line side of the nonvolatile memory cell to be programmed. For example, the magnitude of current from the second bit line through any nonvolatile memory cells on the second bit line side of the nonvolatile memory cell is limited to less than one fifth of a magnitude of current through the nonvolatile memory cell to be programmed.

In some embodiments, the third bit line voltage reduces a magnitude of drain-to-source voltage of any nonvolatile memory cells on the second bit line side of the nonvolatile memory cell to be programmed. For example, the magnitude of drain-to-source voltage of any nonvolatile memory cells on the second bit line side of the nonvolatile memory cell is limited to less than one quarter of a magnitude of drain-to-source voltage of the nonvolatile memory cell.

In some embodiments, the third bit line voltage substantially prevents programming of any nonvolatile memory cells on the second bit line side of the nonvolatile memory cell.

Some embodiments include the step of providing the third bit line voltage from bit line circuitry reducing the first bit line voltage to the third bit line voltage. For example, the bit line circuitry is a transistor with a clamp bias.

Another embodiment includes the following step: in a separate programming operation to program a second nonvolatile memory cell electrically coupled to the third bit line, applying the first bit line voltage to the third bit line to program the second nonvolatile memory cell. Thus the third bit line is used for not just supplying a secondary voltage during programming to alleviate program disturb, but to apply the primary programming voltage as well.

In another embodiment, the logic applies the third bit lines voltage, if the program operation fails to program the nonvolatile memory cell a predetermined number of times, such as when program verify fails. The program voltage is raised iteratively, and the third bit line voltage is applied when the program voltage on the first bit line is raised to at least about six volts.

Another aspect is a method of programming an array of nonvolatile memory cells, as described herein. One embodiment includes the following step(s), responsive to an instruction to program a nonvolatile memory cell of the array, applying a voltage arrangement to bit lines of the array to program the nonvolatile memory cell. The step of applying the voltage arrangement to the bit lines includes multiple substeps, as follows:

applying a first bit line voltage to a first bit line electrically connected to a first current-carrying terminal of a nonvolatile memory cell of the array;

applying a second bit line voltage to a second bit line electrically connected to a second current-carrying terminal of the nonvolatile memory cell; and applying a third bit line voltage to a third bit line electrically connected to at least one nonvolatile memory cell on a second bit line side of the nonvolatile memory cell.

The first bit line voltage has a larger magnitude than the second bit line voltage. The third bit line voltage has a magnitude in between magnitudes of the first bit line voltage and the second bit line voltage.

BRIEF DESCRIPTION OF THE DRAWINGS

FIG. 3 models the loading of the memory array to determine a current associated with the program disturb effect, reduced by a medium voltage on a bit line.

FIG. 4 models the loading of the memory array to determine a current associated with the program disturb effect, reduced by a medium voltage on another bit line.

FIGS. 6A, 6B, 7A, 7B, 8A, 8B, 9A, 9B, 10A. 10B, 11A, and 11B are voltage and current trace simulations the shows the reduced program disturb effect.

DETAILED DESCRIPTION

Figure 1:
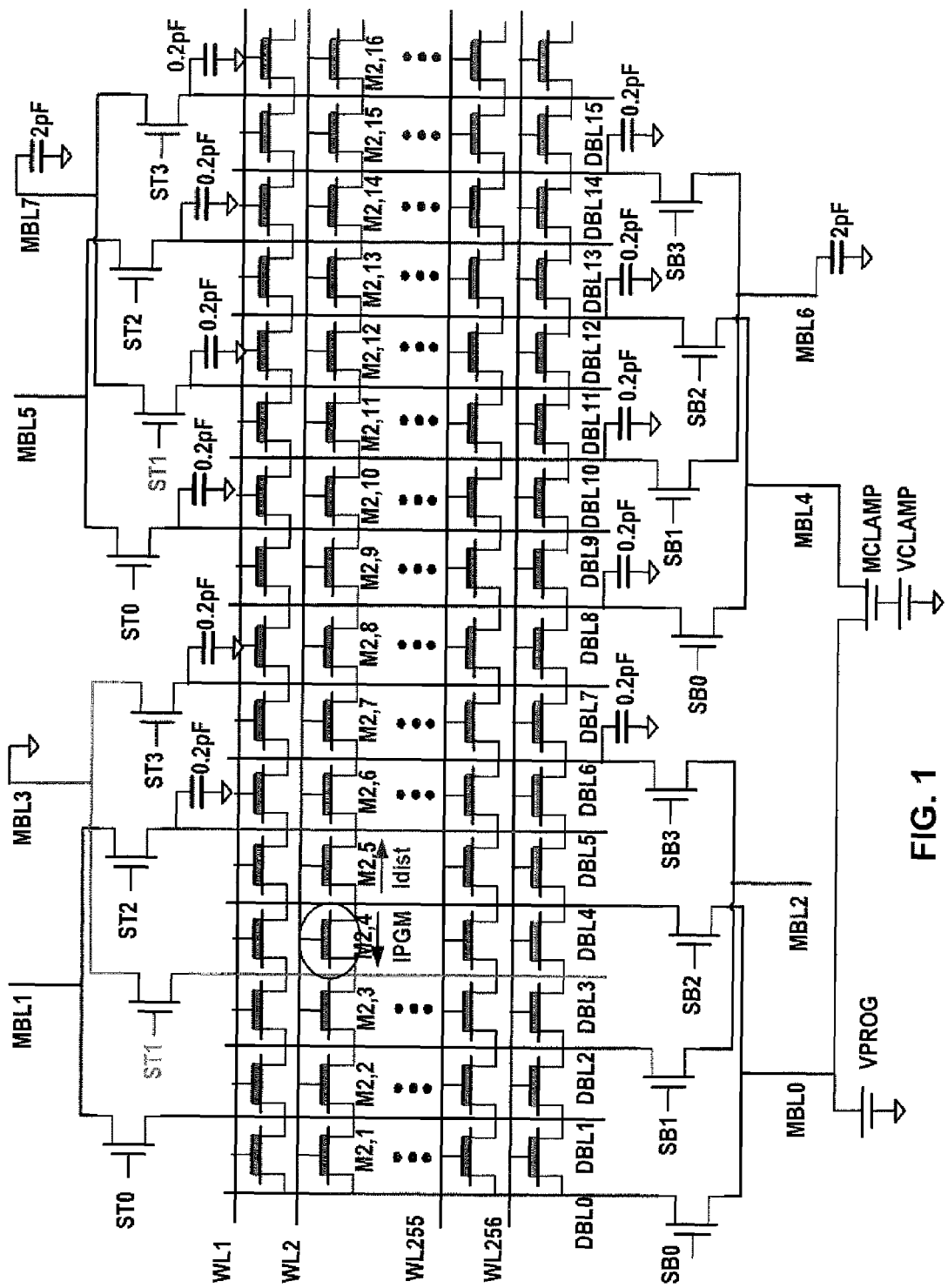
FIG. 1 shows a nonvolatile memory array accessed by word lines, diffusion bit lines, and metal bit lines, which reduces or eliminates the program disturb effect.

FIG. 1 shows a nonvolatile memory array accessed by word lines, diffusion bit lines, and metal bit lines, which reduces or eliminates the program disturb effect. The array is arranged in rows and columns. The rows of nonvolatile memory cells are accessed by word lines WL1, WL2, ..., WL255, and WL256. The columns of nonvolatile memory cells are accessed by diffusion bit lines DBL0, DBL1, ..., etc. The diffusion bit lines are in turn selectively electrically connected to metal bit lines MBL0, MBL1, ..., etc.

A set of select lines and transistors selectively electrically connect each metal bit line to multiple diffusion bit lines, as follows:

Metal bit line MBL1 is electrically connected to the drain of a transistor whose source is electrically connected to diffusion bit line DBL1, and whose gate is electrically connected to select line ST0. Similarly, metal bit line MBL1 is also electrically connected to the drain of a transistor whose source is electrically connected to diffusion bit line DBL5, and whose gate is electrically connected to select line ST2.

Metal bit line MBL3 is electrically connected to the drain of a transistor whose source is electrically connected to diffusion bit line DBL3, and whose gate is electrically connected to select line ST1. Similarly, metal bit line MBL3 is also electrically connected to the drain of a transistor whose source is electrically connected to diffusion bit line DBL7, and whose gate is electrically connected to select line ST3.

Metal bit line MBL5 is electrically connected to the drain of a transistor whose source is electrically connected to diffusion bit line DBL9, and whose gate is electrically connected to select line ST0. Similarly, metal bit line MBL5 is also electrically connected to the drain of a transistor whose source is electrically connected to diffusion bit line DBL13, and whose gate is electrically connected to select line ST2.

Metal bit line MBL7 is electrically connected to the drain of a transistor whose source is electrically connected to diffusion bit line DBL11, and whose gate is electrically connected to select line ST1. Similarly, metal bit line MBL7 is also electrically connected to the drain of a transistor whose source is electrically connected to diffusion bit line DBL15, and whose gate is electrically connected to select line ST3.

Metal bit line MBL0 is electrically connected to the drain of a transistor whose source is electrically connected to diffusion bit line DBL0, and whose gate is electrically connected to select line SB0. Similarly, metal bit line MBL0 is also electrically connected to the drain of a transistor whose source is electrically connected to diffusion bit line DBL4, and whose gate is electrically connected to select line SB2.

Metal bit line MBL2 is electrically connected to the drain of a transistor whose source is electrically connected to diffusion bit line DBL2, and whose gate is electrically connected to select line SB1. Similarly, metal bit line MBL2 is also electrically connected to the drain of a transistor whose source is electrically connected to diffusion bit line DBL6, and whose gate is electrically connected to select line SB3.

Metal bit line MBL4 is electrically connected to the drain of a transistor whose source is electrically connected to diffusion bit line DBL8, and whose gate is electrically connected to select line SB0. Similarly, metal bit line MBL4 is also electrically connected to the drain of a transistor whose source is electrically connected to diffusion bit line DBL12, and whose gate is electrically connected to select line SB2.

Metal bit line MBL6 is electrically connected to the drain of a transistor whose source is electrically connected to diffusion bit line DBL10, and whose gate is electrically connected to select line SB1. Similarly, metal bit line MBL6 is also electrically connected to the drain of a transistor whose source is electrically connected to diffusion bit line DBL14, and whose gate is electrically connected to select line SB3.

In FIG. 1 an instruction has been received to program memory cell M2,4. A bias VPROG is applied to metal bit line MBL0, and select line SB2 is on, allowing the bias VPROG to bias diffusion bit line DBL4. Also, metal bit line MBL3 is grounded, and select line ST1 is on, allowing the ground voltage to bias diffusion bit line DBL3. Finally, word line WL2 is on.

As a result, a programming current IPGM flows from diffusion bit line DBL4, through memory cell M2,4, and to diffusion bit line DBL3. In otherwise, the programming current flows from the diffusion bit line DBL4-side of memory cell M2,4, to the diffusion bit line DBL3-side of memory cell M2,4.

Unfortunately, a programming disturb current Idist flows in the other direction, from diffusion bit line DBL4, through memory cells on the diffusion bit line DBL4-side of memory cell M2,4 (e.g., M2, 5; M2, 6; etc.). Whether these memory cells are disturbed, depends on the magnitude of the disturb current Idist.

Figure 2:
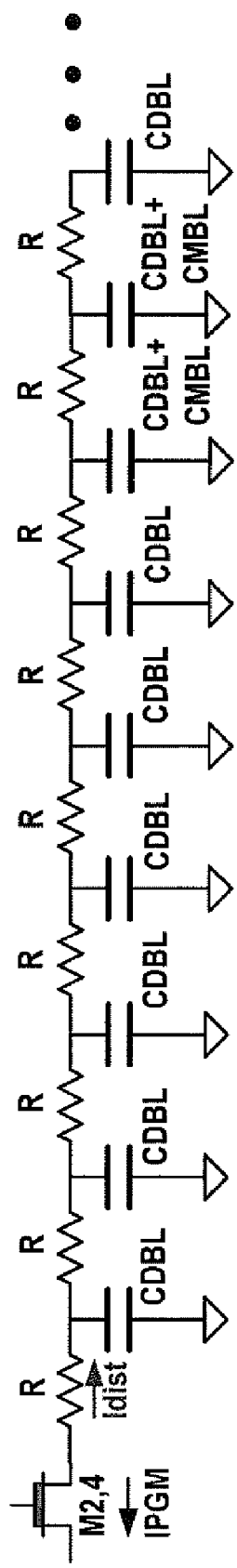
FIG. 2 models the loading of the memory array to determine the current which can cause the program disturb effect.

FIG. 2 models the loading of the memory array to determine the current which can cause the program disturb effect.

The disturb current Idist is disturbed by the load and the terminating voltage presented. Loads are shown in FIG. 1 as capacitances modeling the diffusion bit lines and the metal bit lines, as well as series resistances from the memory cells.

FIG. 3 models the loading of the memory array to determine a current associated with the program disturb effect, reduced by a medium voltage on a bit line. The capacitance of each diffusion bit line is modeled by a capacitor CDBL, and the capacitance of each metal line is modeled by a capacitor CMBL. A medium voltage V is applied to one of the metal bit lines, between the programming voltage and ground, very roughly in the middle. The medium voltage V greatly reduces the magnitude of the disturb current Idist.

FIG. 4 models the loading of the memory array to determine a current associated with the program disturb effect, reduced by a medium voltage on another bit line. The medium voltage V is applied to a later metal bit line than in FIG. 3.

Returning to FIG. 1, the programming voltage VPROG is electrically connected to not just metal bit line MBL0, but also metal bit line MBL4 through bit line circuitry transistor MCLAMP. The gate of transistor MCLAMP is connected to clamp bias VCLAMP, which lowers the bit line voltage passed to metal bit line MBL4. IN one example, the clamp bias is 4.7 V, and the voltage passed to metal bit line MBL4 is 4 V.

Select signal SB2 is on, allowing the programming voltage VPROG to pass to diffusion bit line DBL4. The same select signal SB2 allows the clamped voltage from transistor MCLAMP to pass to diffusion bit line DBL12. The result is a greatly reduced disturb current Idist, with no programming disturb or greatly reduced programming disturb.

Figure 5:
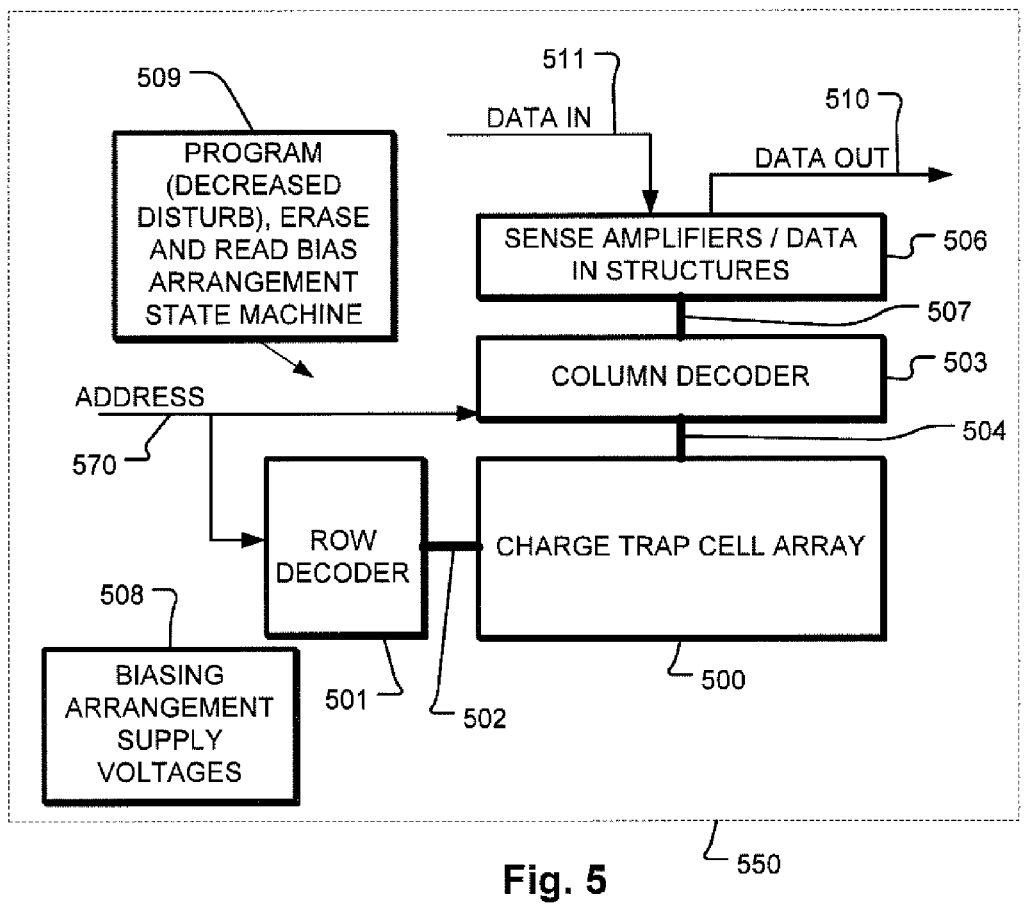
FIG. 5 shows an example integrated circuit with a nonvolatile memory array and a state machine that reduces the program disturb effect.

FIG. 5 shows an example integrated circuit with a nonvolatile memory array and a state machine that reduces the program disturb effect.

The integrated circuit 550 includes a memory array 500 implemented using memory cells with resistive elements on a semiconductor substrate. Addresses are supplied on bus 570 to column decoder 503 and row decoder 501. Sense amplifiers and data-in structures in block 506 are coupled to the column decoder 503 via data bus 507. Data is supplied via the data-in line 511 from input/output ports on the integrated circuit 550, or from other data sources internal or external to the integrated circuit 550, to the data-in structures in block 506. Data is supplied via the data-out line 510 from the block 506 to input/output ports on the integrated circuit 550, or to other data destinations internal or external to the integrated circuit 550. The integrated circuit 550 may also include circuitry directed a mission function other than the nonvolatile storage with resistive elements (not shown). Bias arrangement state machine 509 controls the application of bias arrangement supply voltages, including the decreased or eliminated programming disturb.

FIGS. 6A, 6B, 7A, 7B, 8A, 8B, 9A, 9B, 10A. 10B, 11A, and 11B are voltage and current trace simulations the shows the reduced program disturb effect. The full program pulse lasts 500 nsec.

To demonstrate the wide applicability of the procedure to reduce programming disturb, nonvolatile memory cells of varying properties were simulated.

The following table summarizes the voltage and current trace simulations.

| | | Vth = 1.57 V FIGS. 6A, 6B, 9A, 9B | Vth = 1.96 V FIGS. 7A, 7B, 10A, 10B | Vth = 2.44 V FIGS. 8A, 8B, 11A, 11B |
|---|---|---|---|---|
| Program Disturb Effect FIGS. 6A, 6B, 7A, 7B, 8A, 8B | Vds PGM (V) | 6.28 | 6.3 | 6.32 |
| | Vds dist (v) | 2.06 | 2.24 | 2.43 |
| | I PGM (uA) | 86.5 | 86.8 | 87.1 |
| | I dist (uA) | 43.1 | 38.6 | 34.3 |
| Reduced/No Program Disturb Effect FIGS. 9A, 9B, 10A, 10B, 11A, 11B | Vds PGM (V) | 6.41 | 6.43 | 6.45 |
| | Vds dist (V) | 1.13 | 1.3 | 1.48 |
| | I PGM (uA) | 88.2 | 88.4 | 88.7 |
| | I dist (uA) | 15.9 | 11.4 | 7.51 |

The program disturb effect is most pronounced when the programming voltage is high, and the nonvolatile memory cells in the path if the disturb current Idist are fresh, or erased. The programming voltage is highest, when a program instruction is being carried out, but program verify fails multiple times. Each time program verify fails, the program voltage is raised. The table below shows an example of the increasing programming voltage as program verify repeatedly fails.

| # of Program Attempt | Vd (V) |
|---|---|
| 1 | 4.5 |
| 2 | 4.6 |
| 3 | 4.7 |
| 4 | 4.8 |
| 5 | 4.9 |
| 6 | 5.0 |
| 7 | 5.1 |
| 8 | 5.2 |
| 9 | 5.4 |
| 10 | 5.6 |
| 11 | 5.8 |
| 12 | 6.0 |
| 13 | 6.2 |
| 14 | 6.4 |
| 15 | 6.7 |
| 16 | 7.0 |

In this example, the medium voltage is applied on the twelfth attempt and later, as the programming voltage has risen sufficiently high to result in program disturb. The number of attempts at which the medium voltage is applied is illustratively only, and varies with the implementation. Similarly, the programming voltages applied at each attempt are illustratively only, and vary with the implementation.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating memory, comprising:
programming a memory cell of a memory array comprising a first bit line coupled to a first terminal of the memory cell, a second bit line coupled to a second terminal of the memory cell, and a third bit line coupled to another memory cell closer to the first bit line than the second bit line, the third bit line separated from the first bit line by at least one bit line, comprising:
enabling a first voltage to bias the first bit line;
enabling a second voltage to bias the second bit line;
enabling a third voltage to bias the third bit line, wherein the third voltage has a voltage value between the first voltage and the second voltage; and
disabling the first voltage, the second voltage, and the third voltage from biasing said at least one bit line.

2. The method of claim 1, further comprising:
applying a clamp bias to gate of a clamp transistor having a first terminal coupled to the first bit line and a second terminal coupled to the third bit line.

3. The method of claim 1, further comprising:
coupling a metal bit line to a plurality of bit lines via select transistors, the plurality of bit lines including only one of the first bit line and the second bit line.

4. The method of claim 1, wherein
said enabling the first voltage includes applying the first voltage via a first metal bit line and a select transistor coupling the first metal bit line to the first bit line; and
said enabling the third voltage includes coupling the first voltage to the third bit line via: a clamp transistor dropping the first voltage to the third voltage, a second metal bit line, and a select transistor coupling the second metal bit line to the third bit line.

5. The method of claim 1, further comprising:
receiving a select transistor signal turning on a first select transistor coupling the first voltage from a first metal bit line to the first bit line, and turning on a second select transistor coupling the first voltage from a second metal bit line to the third bit line.

6. The method of claim 1, further comprising:
receiving a select transistor signal turning on a first select transistor coupling the first voltage from a first metal bit line to the first bit line, and turning on a second select transistor coupling the first voltage from a second metal bit line to the third bit line via a clamp transistor dropping the first voltage to the third voltage.

7. The method of claim 1, wherein the first bit line, the second bit line, and the third bit line are diffusion bit lines.

8. A memory apparatus, comprising:
a memory array, comprising:
a first bit line coupled to a first terminal of a memory cell in the memory array;
a second bit line coupled to a second terminal of the memory cell;
a third bit line coupled to another memory cell closer to the first bit line than the second bit line, the third bit line separated from the first bit line by at least one bit line; and
bias circuitry enabled to apply a programming bias including a first voltage to the first bit line, a second voltage to the second bit line, a third voltage to the third bit line,
wherein the third voltage has a voltage value between the first voltage and second voltage, and the bias circuitry is disabled from applying the first voltage, the second voltage, and the third voltage to said at least one bit line.

9. The apparatus of claim 8, further comprising:
a clamp transistor having a gate coupled to a clamp bias, a first terminal coupled to the first bit line and a second terminal coupled to the third bit line.

10. The apparatus of claim 8, further comprising:
a metal bit line coupled to a plurality of bit lines via select transistors, the plurality of bit lines including only one of the first bit line and the second bit line.

11. The apparatus of claim 8, further comprising:
a first metal bit line coupled to a first plurality of bit lines via select transistors, the first plurality of bit lines including the first bit line but not the second bit line, the first metal bit line coupling the first voltage to the first bit line;
a second metal bit line coupled to a second plurality of bit lines via select transistors, the plurality of bit lines including the third bit line but neither the first bit line not the second bit line;
a clamp transistor having a gate coupled to a clamp bias, a first terminal coupled to the first metal bit line, and a second terminal coupled to the second metal bit line.

12. The apparatus of claim 8, further comprising:
a first select transistor turned on by a select signal by coupling the first voltage from a first metal bit line to the first bit line; and
a second select transistor turned on by the select signal by coupling the first voltage from a second metal bit line to the third bit line.

13. The apparatus of claim 8, further comprising:
a first select transistor turned on by a select signal by coupling the first voltage from a first metal bit line to the first bit line; and
a second select transistor turned on by the select signal by coupling the first voltage from a second metal bit line to the third bit line via a clamp transistor dropping the first voltage to the third voltage.

14. The apparatus of claim 8, wherein the first bit line, the second bit line, and the third bit line are diffusion bit lines.

* * * * *